United States Patent
Ku et al.

(10) Patent No.: US 6,184,119 B1
(45) Date of Patent: Feb. 6, 2001

(54) METHODS FOR REDUCING SEMICONDUCTOR CONTACT RESISTANCE

(75) Inventors: Victor Ku; Delbert Parks, both of San Antonio, TX (US)

(73) Assignee: VLSI Technology, Inc., San Jose, CA (US)

( * ) Notice: Under 35 U.S.C. 154(b), the term of this patent shall be extended for 0 days.

(21) Appl. No.: 09/270,123

(22) Filed: Mar. 15, 1999

(51) Int. Cl.[7] .................... H01L 21/44; H01L 21/4763; H01L 21/302

(52) U.S. Cl. ................... 438/597; 438/637; 438/706; 438/720

(58) Field of Search ................... 438/597, 637, 438/695, 706, 720, 725

(56) References Cited

U.S. PATENT DOCUMENTS

| | | | |
|---|---|---|---|
| 5,176,790 | * 1/1993 | Arleo et al. | 156/643 |
| 5,269,879 | * 12/1993 | Rhoades et al. | 156/643 |
| 5,417,826 | * 5/1995 | Blalock | 204/176 |
| 5,468,342 | * 11/1995 | Nutty et al. | 156/643.1 |
| 5,514,247 | * 5/1996 | Shan et al. | 156/643.1 |
| 5,661,083 | * 8/1997 | Chen et al. | 438/637 |
| 5,681,780 | 10/1997 | Mihara et al. | 437/228 |
| 5,851,302 | 12/1998 | Solis | 134/1.2 |
| 6,033,990 | 3/2000 | Kishimoto et al | 438/710 |

FOREIGN PATENT DOCUMENTS

| | | | |
|---|---|---|---|
| 0 644 584 | 3/1995 | (EP) | H01L/21/311 |
| 0 746 017 | 12/1996 | (EP) | H01L/21/738 |
| 0 867 924 | 9/1998 | (EP) | H01L/21/311 |
| 10256232 | 9/1998 | (JP) | H01L/21/3065 |

* cited by examiner

Primary Examiner—Matthew Smith
Assistant Examiner—Lex H. Malsawma
(74) Attorney, Agent, or Firm—Mikio Ishimaru

(57) ABSTRACT

A method is provided for reducing contact resistances in semiconductors. In the use of fluorocarbon plasmas during high selectively sub-quarter-micron contact hole etching, with the silicon dioxide($SiO_2$)/silicon nitride($Si_3N_4$)/silicide ($TiSi_x$) layers, polymerization effects have been discovered to be crucial. The process includes using a high etch selective chemistry, to remove $SiO_2$ first, then switching to another chemistry with high selectivity of $Si_3N_4$-to-$TiSi_x$. To obtain good etch selectivity of $SiO_2$-to-$Si_3N_4$, fluorocarbon plasmas containing high C/F ratio are employed. This results in the formation of reactive unsaturated polymers which stick easily to contact hole sidewalls and bottoms. Fluorine from the polymer was discovered to severely degrade the etch selectivity of $Si_3N_4$-to-$TiSi_x$. Different polymer removing methods to restore etch selectivity of $Si_3N_4$-to-$TiSi_x$ are provided which can be applied to any highly selective etching of oxide versus nitride.

14 Claims, 3 Drawing Sheets

METHODS FOR REDUCING SEMICONDUCTOR CONTACT RESISTANCE

TECHNICAL FIELD

The present invention relates generally to formation of contact holes and vias in the manufacture of semiconductor and more particularly to reducing contact resistance while forming the contact holes and vias.

BACKGROUND OF THE INVENTION

In the fabrication of integrated circuits, polysilicon gates are deposited on silicon substrates and source/drain junctions implanted into the silicon substrates to form the transistors. Various interlayer dielectric materials are deposited on the gates and junctions for the formation of various layers of metal interconnections. Then various etching steps are used to form holes through the interlayer dielectric materials into which conductive materials will be deposited to form the contacts and interconnections of the integrated circuits.

The etching steps need to take place in a highly selective fashion with respect to the underlying layer, i.e., the etch for a layer should remove that layer relatively quickly while not removing or very slowly removing the underlying layer. To obtain good etch selectivity, fluorocarbon plasmas containing high carbon to fluorine (C/F) ratios are usually employed.

Unfortunately, polymerization readily occurs in chemistries having high C/F ratios.

This tends to generate quantities of polymers that are not easily removed. Even the ion bombardment is insufficient to remove the polymers. The mechanism for obtaining high etch selectivity is the difference in formation of polymers on different materials.

For example, with a silicon dioxide ($SiO_2$) dielectric layer and a silicon nitride ($Si_3N_4$) etch stop layer, a dual-frequency driven plasma source may be used for the contact etch process because it can achieve high etch selectivity of $SiO_2$-to-$Si_3N_4$. The plasma contains a high C/F ratio which creates reactive unsaturated polymers which can stick easily to contact hole sidewall and bottom and, then, create thick polymer layers. Once the $SiO_2$ dielectric layer is cleared over the $Si_3N_4$ stop layer, and oxygen is no longer being brought into the local environment from the $SiO_2$ etch process, the polymer tends to accumulate at a significant rate.

In $SiO_2$ etch, using $C_xF_y$ as etchant, free fluorine is made responsible for the etch, forming SiF in the reaction with silicon. CF and $CF_2$ are precursors for the formation of the fluorocarbon polymers. This fluorocarbon layer deposition is reduced on oxide surfaces by the reaction between the oxygen released by dissociation during $SiO_2$ etching and the carbon in the deposited polymer. Volatile compounds such as CO, $CO_2$ or $COF_2$ are formed during the etch. On non-oxide surfaces (or $Si_3N_4$ surface) polymer layers should be formed, protecting the surface from free fluorine.

However, a potential drawback of leaving a thick polymer layer over $Si_3N_4$ is to lower the etch selectivity of $Si_3N_4$-to-silicide ($TiSi_x$). The silicide is formed on the polysilicon gate to provide low contact resistance bonding to the conductive contact metals. Fluorine from the deposited polymer can reduce, substantially, the etch selectivity of $Si_3N_4$-to-$TiSi_x$ on fully processed wafers. This can cause open or high contact resistances.

A method for increasing the etch selectivity and the process window for etching semiconductor contacts has been long sought, but has long eluded those skilled in the art.

DISCLOSURE OF THE INVENTION

The polymerization effects in fluorocarbon plasmas during high selectively sub-quarter-micron contact hole etching create thick polymer layers. It has been discovered that these thick polymer layers, formed during the dielectric removal step, reduce the etch selectivity to various underlayer dielectric layers, and which could increase contact resistance. The present invention provides for removal of the polymer after dielectric etch prior to the etch step for the next underlying layer to improve the etch selectivity and reduce the contact resistance.

The polymerization effects in high C/F ratio fluorocarbon plasmas during high selectively sub-quarter-micron contact hole etching of silicon dioxide layer create thick polymer layers. It has been discovered that these thick polymer layers reduce the etch selectivity of the etching of silicon dioxide to nitride layers, and possibly nitride to silicide layers as well, and it results in contact resistance increase. The present invention provides for removal of the polymer after silicon dioxide etch prior to the etch step for the next underlying layer to improve the etch selectivity and reduce the contact resistance.

The polymerization effects in high C/F ratio fluorocarbon plasmas during high selectively sub-quarter-micron contact hole etching of silicon dioxide ($SiO_2$) create thick polymer layers. It has been discovered that fluorine from the polymer will severely degrade the etch selectivity of $SiO_2$-to-$Si_3N_4$, and possibly $Si_3N_4$-to-$TiSi_x$, and increase contact resistance. The present invention provides for removal of the polymer after $SiO_2$ etch prior to the etch step for the next underlying layer to improve the etch selectivity and reduce the contact resistance.

This polymerization effect is even more important when the technology goes to sub-quarter-micron because of the thinner underlying layers of silicon dioxide layers, such as nitride etch stop and silicide layers. Therefore, the elimination of the polymerization effects after silicon dioxide etch prior to the etch step for the next underlying layer becomes even useful in the structuring of a robust process in the future.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
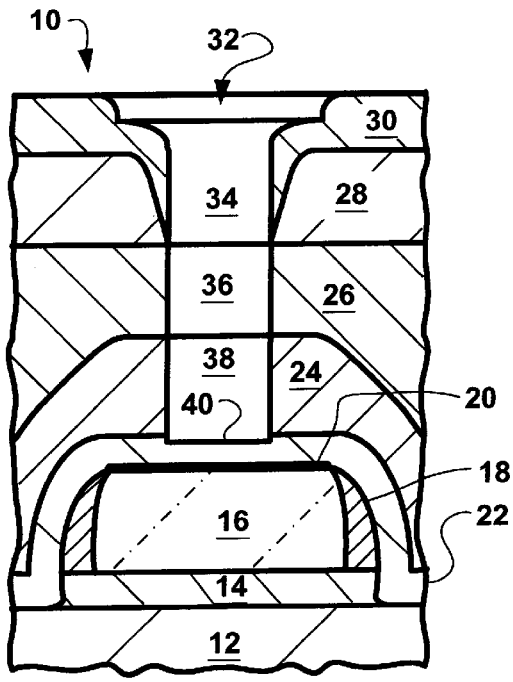
FIG. 1 (PRIOR ART) is a partial close-up section of a semiconductor device gate with a contact hole subject to polymer buildup where the device is in the center of a semiconductor wafer.

Referring now to FIG. 1, therein is shown a partial close-up section of a portion of a semiconductor wafer (not shown) with a semiconductor device 10 on a semiconductor substrate 12 having a gate oxide 14 and a polysilicon gate 16 formed thereon. The polysilicon gate 16 has a silicide layer 20 formed on top and a sidewall spacer 18 is formed around it.

An etch stop or nitride layer 22 is deposited over the silicon substrate 12, the spacer 18, and the silicide layer 20. Above the nitride layer 22 is a conformal dielectric or oxide layer 24 that roughly parallels the shape of the polysilicon gate 16. The oxide layer 24 is deposited by HDP (High Density Plasma) source. A planar interlayer dielectric or PSG oxide layer 26 is deposited on the oxide layer 24.

A photoresist 28 is deposited on the oxide layer 26. During processing, the photoresist 28 is photolithographically exposed and developed to form the hole 32.

During the semiconductor manufacturing process, the photoresist 28 is subject to a plasma etch and plasma is directed through the opening 32 to etch the holes 34, 36, and 38. The hole 38 has a bottom 40, which is shown slightly etched into the nitride layer 22 as will later be explained. It would be understood by those skilled in the art that the term "hole" refers to the contact hole from an interconnect to the transistor while the term "via" encompasses holes and connections between different levels of interconnect. While etching the holes, a polymer layer 30 forms over the sides of the holes 34, 36, and 38 and the bottom 40 of the hole 38 (for simplicity, the polymer layer 30 is shown only where it is the thickest).

In the preferred embodiment, the silicide layer 20 is titanium silicide ($TiSi_x$), the oxide layers 24 and 26 are of silicon dioxide ($SiO_2$), and the nitride layer 22 is of silicon nitride ($Si_3N_4$). A plasma with a gas mixture of $C_4F_8/CF_4/CO/Ar$ is used for the $SiO_2$ etch chemistry and selective gas mixture of $CHF_3/O_2$ for the $Si_3N_4$ etch chemistry. When a conductive metal fills the contact holes, the contact resistance will be high if the $Si_3N_4$ is not etched away and the metal is not in contact with the $TiSi_x$. Similarly, if the $TiSi_x$ is etched away and the metal is in contact with the polysilicon of the gate 16, the contact resistance will be high. The time between the etching away of the $Si_3N_4$ and the etching away of the $TiSi_x$ is called the "process time window" and is the period during which the contact resistance will be low for all the gate and diffusion contacts. A long process time window, generally measured in seconds, is highly desirable to increase process tolerances.

Figure 2:
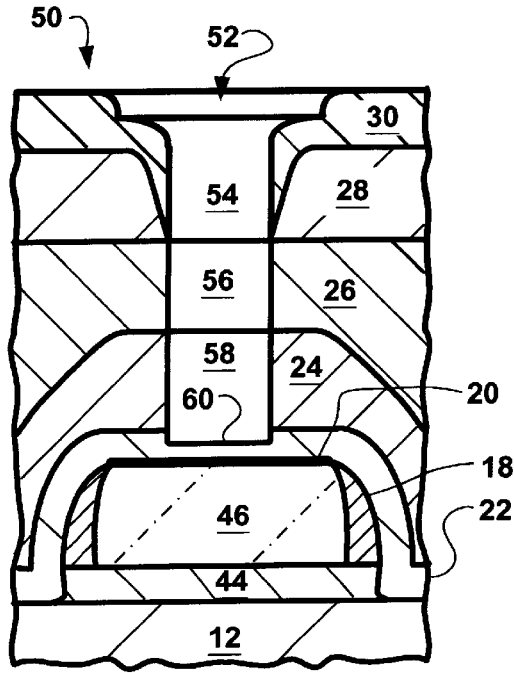
FIG. 2 (PRIOR ART) is a partial close-up section of a semiconductor device gate with a contact hole subject to polymer buildup where the device is near the edge of the semiconductor wafer.

Referring now to FIG. 2, therein is shown a partial close-up section of a portion of the semiconductor wafer with semiconductor device 50 located at the edge of the wafer. The semiconductor device 50 includes a gate oxide 44 and a polysilicon gate 46 formed on the silicon substrate 12. The same numbers are used in FIG. 2 to designate the continuations of the layers in FIG. 1.

During the semiconductor manufacturing process, the photoresist 28 is subject to a plasma etch and plasma is directed through the opening 52 to etch the holes 54, 56, and 58. The hole 58 has a bottom 60, which is shown etched into the nitride layer 22 further than the bottom 40 in FIG. 1, as will later be explained. While etching the holes, the polymer layer 30 forms over the sides of the holes 54, 56, and 58 and the bottom 60 of the hole 58.

When a conductive metal fills the contact holes, the contact resistance will be high if the $Si_3N_4$ is not etched away and the metal is not in contact with the $TiSi_x$ on the silicon of the diffusion contact 62. Similarly, if the $TiSi_x$ is etched away and the metal is in contact with the silicon of the diffusion contact 62 the contact resistance will be high.

Figure 3:
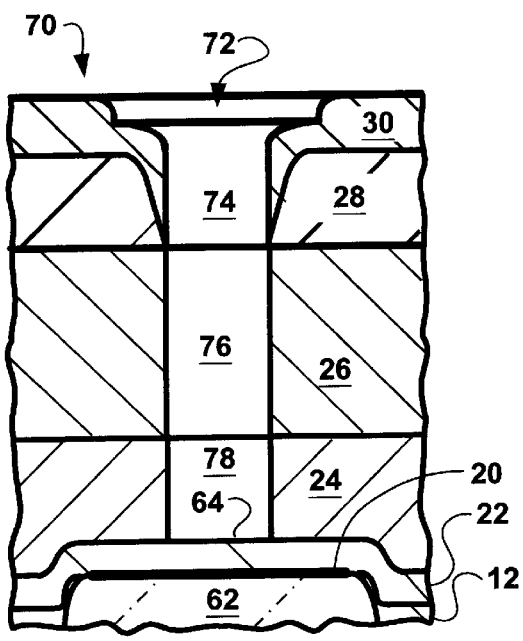
FIG. 3 (PRIOR ART) is a partial close-up section of a semiconductor device diffusion contact with a contact hole subject to polymer buildup where the device is in the center of the semiconductor wafer.

Referring now to FIG. 3, therein is shown a partial close-up section of a portion of the semiconductor wafer with a semiconductor device 70 located at the center of the wafer. The semiconductor device 70 has a diffusion contact 62 implanted within the semiconductor substrate 12. The same layers as in FIG. 1 are numbered with the same numbers. The plasma etches through the opening 72 to form the holes 74, 76, and 78. The hole 78 has a bottom 64, which is the surface of the nitride layer 22.

During the semiconductor manufacturing process, the photoresist 28 is subject to a plasma etch and plasma is directed through the opening 72 to etch the holes 74, 76, and 78. The hole 78 has a bottom 64, which is shown etched right to the nitride layer 22, as will later be explained. While etching the holes, the polymer layer 30 forms over the holes 74, 76, and 78 and the bottom 64 of the hole 78.

When a conductive metal fills the contact holes, the contact resistance will be high if the $Si_3N_4$ is not etched away and the metal is not in contact with the $TiSi_x$ on the silicon of the diffusion contact 62. Similarly, if the $TiSi_x$ is etched away and the metal is in contact with the silicon of the diffusion contact 62 the contact resistance will be high.

Figure 4:
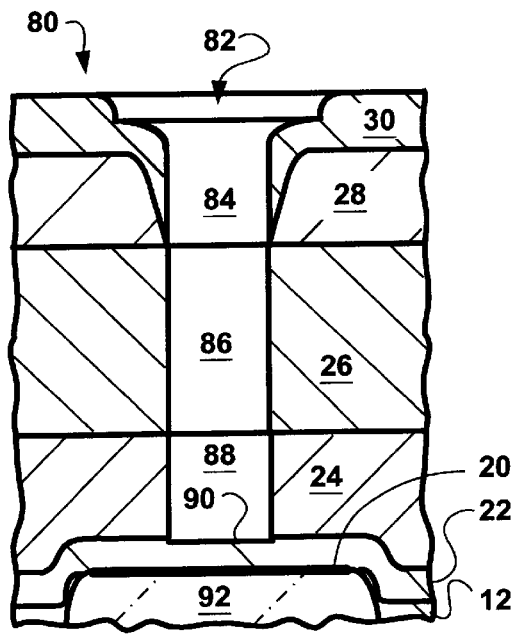
FIG. 4 (PRIOR ART a partial close-up section of a semiconductor device diffusion contact with a contact hole subject to polymer buildup where the device is near the edge of the semiconductor wafer.

Referring now to FIG. 4, therein is shown a partial close-up section of a portion of the semiconductor wafer with a semiconductor device 80 located at the edge of the wafer. The semiconductor device 80 has a diffusion contact 92 implanted in the semiconductor substrate 12. The same layers as in FIG. 1 have the same numbers herein. The plasma etches through the opening 82 and etches the holes 84, 86, and 88. The bottom 90 of the hole 88 is etched into the nitride layer 22 further than the bottom 64 of FIG. 3.

During the semiconductor manufacturing process, the photoresist 28 is subject to a plasma etch and plasma is directed through the opening 82 to etch the holes 84, 86, and 88. The hole 88 has a bottom 90, which is shown etched into the nitride layer 22 further than the bottom 40 in FIG. 1, as will later be explained. While etching the holes, a polymer layer 30 forms over the holes 84, 86, and 88 and the bottom 90 of the hole 88.

When a conductive metal fills the contact holes, the contact resistance will be high if the $Si_3N_4$ is not etched away and the metal is not in contact with the $TiSi_x$ on the silicon of the diffusion contact 92. Similarly, if the $TiSi_x$ is etched away and the metal is in contact with the silicon of the diffusion contact 92 the contact resistance will be high.

Figure 5:
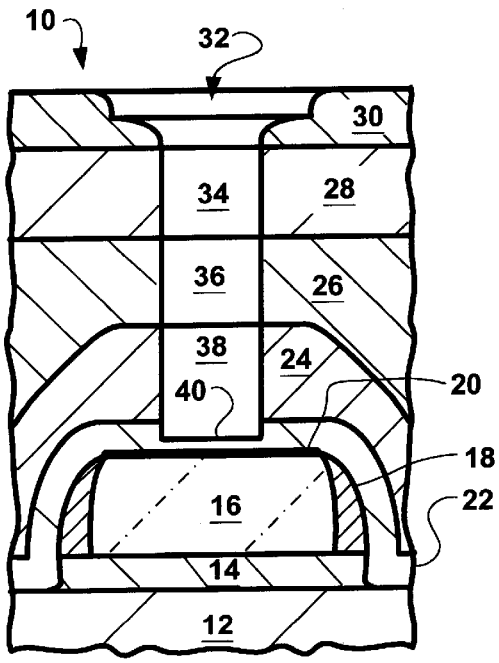
FIG. 5 is a partial close-up section of a semiconductor device gate with a contact hole subject to polymer buildup and elimination of fluorine where the device is in the center of the semiconductor wafer.

Referring now to FIG. 5, therein is shown a partial close-up section of a portion of the semiconductor wafer with the semiconductor device 10 of FIG. 1 located in the center of the wafer and processed in the same way as FIG. 1 through the $SiO_2$ plasma etch step. Then, a fluorine-less, argon/oxygen ($Ar/O_2$) plasma is used to perform an in-situ removal of the polymer 30. The same numbers as used in FIG. 1 are used to designate the same elements.

Although the nitride layer 22 should not be etched by the fluorine-less plasma, it is etched away so the bottom 40 is etched more deeply into the nitride layer 22 over the gate 16 than in FIG. 1.

Figure 6:
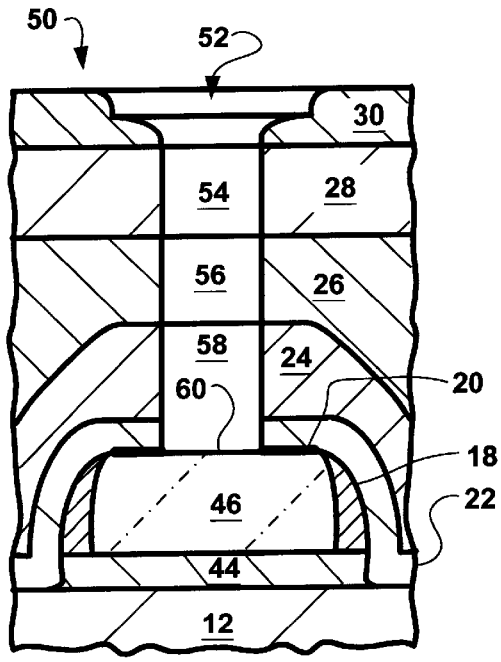
FIG. 6 is a partial close-up section of a semiconductor device gate with a contact hole subject to polymer buildup and elimination of fluorine where the device is near the edge of the semiconductor wafer.

Referring now to FIG. 6, therein is shown a partial close-up section of a portion of the semiconductor wafer with semiconductor device 50 of FIG. 2 located at the edge of the wafer and processed in the same way as FIG. 2 through the $SiO_2$ plasma etch step. Then, the fluorine-less, $Ar/O_2$ plasma is used to perform an in-situ removal of the polymer 30. The same numbers as used in FIG. 2 are used to designate the same elements.

Although the nitride layer 22 should not be etched by the fluorine-less plasma, it is etched away so the bottom 60 is etched more deeply into the nitride layer 22 over the gate 16 than in FIG. 2.

Figure 7:
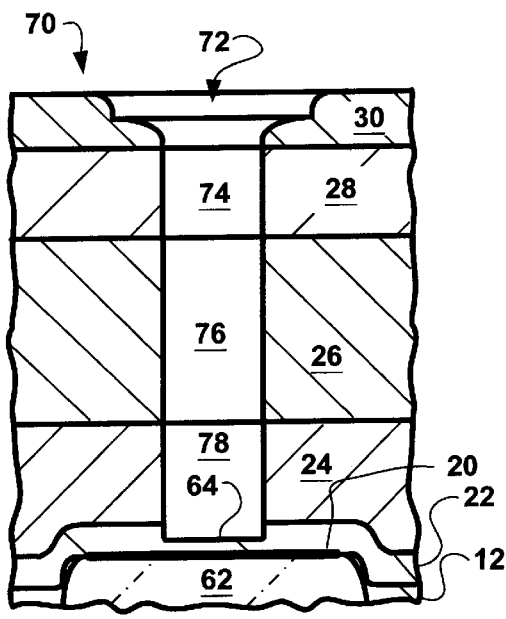
FIG. 7 is a partial close-up section of a semiconductor device diffusion contact with a contact hole subject to polymer buildup and elimination of fluorine where the device is in the center of the semiconductor wafer.

Referring now to FIG. 7, therein is shown a partial close-up section of a portion of the semiconductor wafer with a semiconductor device 70 located at the center of the wafer and processed in the same way as FIG. 3 through the $SiO_2$ plasma etch step. Then, the fluorine-less, $Ar/O_2$ plasma is used to perform an in-situ removal of the polymer 30. The same numbers as used in FIG. 3 are used to designate the same elements.

Although the nitride layer 22 should not be etched by the fluorine-less plasma, it is etched away so the bottom 64 is etched more deeply into the nitride layer 22 over the diffusion contact 62 than in FIG. 3.

Figure 8:
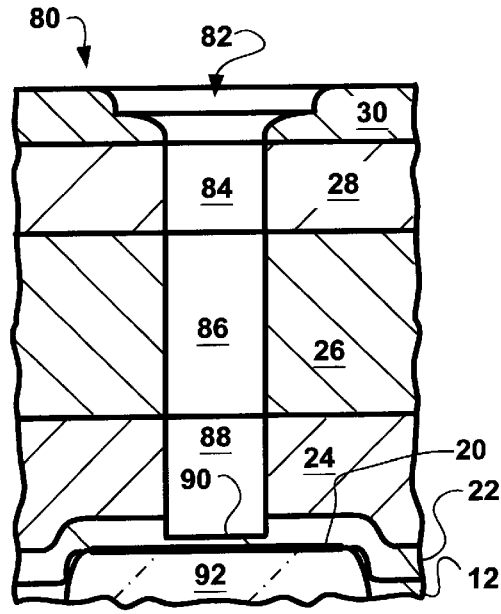
FIG. 8 is a partial close-up section of a semiconductor device diffusion contact with a contact hole subject to polymer buildup and elimination of fluorine where the device is near the edge of the semiconductor wafer.

Referring now to FIG. 8, therein is shown a partial close-up section of a portion of the semiconductor wafer with a semiconductor device 80 located at the edge of the wafer and processed in the same way as FIG. 4 through the $SiO_2$ plasma etch step. Then, the fluorine-less, $Ar/O_2$ plasma is used to perform an in-situ removal of the polymer 30. The same numbers as used in FIG. 4 are used to designate the same elements.

Although the nitride layer 22 should not be etched by the fluorine-less plasma, it is etched away so the bottom 90 is etched more deeply into the nitride layer 22 over the diffusion contact 92 than in FIG. 4.

Figure 9:
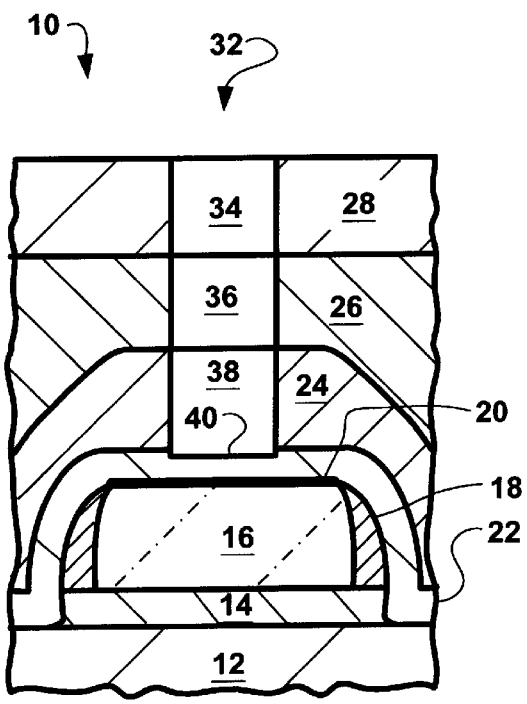
FIG. 9 is a partial close-up section of a semiconductor device gate with a contact hole subject to polymer buildup according to the present invention and elimination of fluorine where the device is in the center of the semiconductor wafer.

Referring now to FIG. 9, therein is shown a partial close-up section of a portion of the semiconductor wafer with the semiconductor device 10 of FIG. 1 located in the center of the wafer and processed in the same way as FIG. 1 through the $SiO_2$ plasma etch step. Then, a non-fluorine activating process is used to perform an in-situ removal of the polymer 30. The same numbers as used in FIG. 1 are used to designate the same elements.

The non-fluorine activating process would be a process from a group including water vapor ashing, oxygen plasma operating at radio frequencies, oxygen plasma operating at microwave frequencies, heating in an ozone ambient, and combinations thereof.

With the non-fluorine activating removal of the polymer 30, the desired contact between the conductive metal in the hole and the silicide layer 20 over the gate 16 is achieved for reduced contact resistance with a long process time window.

Figure 10:
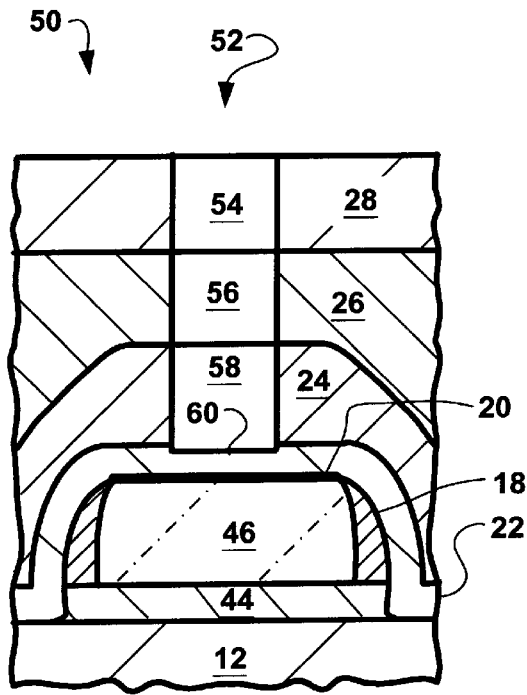
FIG. 10 is a partial close-up section of a semiconductor device gate with a contact hole subject to polymer buildup removal according to the present invention and elimination of fluorine where the device is near the edge of the semiconductor wafer.

Referring now to FIG. 10, therein is shown a partial close-up section of a portion of the semiconductor wafer with the semiconductor device 50 of FIG. 2 located at the edge of the wafer and processed in the same way as FIG. 2 through the $SiO_2$ plasma etch step. Then, the non-fluorine activating process is used to perform an in-situ removal of the polymer 30. The same numbers as used in FIG. 2 are used to designate the same elements.

With the non-fluorine activating removal of the polymer 30, the desired contact between the conductive metal in the hole and the silicide layer 20 over the gate 46 is achieved for reduced contact resistance with a long process time window.

Figure 11:
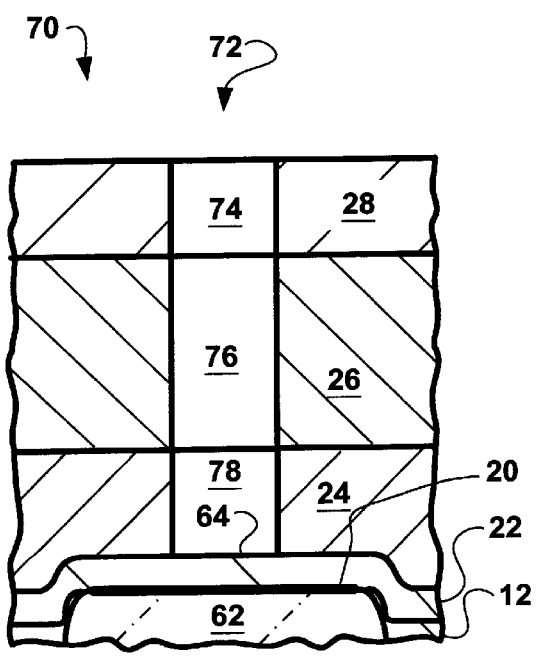
FIG. 11 is a partial close-up section of a semiconductor device diffusion contact with a contact hole subject to polymer buildup removal according to the present invention and elimination of fluorine here the device is in the center of the semiconductor wafer.

Referring now to FIG. 11, therein is shown a partial close-up section of a portion of the semiconductor wafer with the semiconductor device 70 of FIG. 3 located in the center of the wafer and processed in the same way as FIG. 3 through the $SiO_2$ plasma etch step. Then, the non-fluorine activating process is used to perform an in-situ removal of the polymer 30. The same numbers as used in FIG. 3 are used to designate the same elements.

With the non-fluorine activating removal of the polymer 30, the desired contact between the conductive metal in the hole and the silicide layer 20 over the diffusion contact 62 is achieved for reduced contact resistance with a long process time window.

Figure 12:
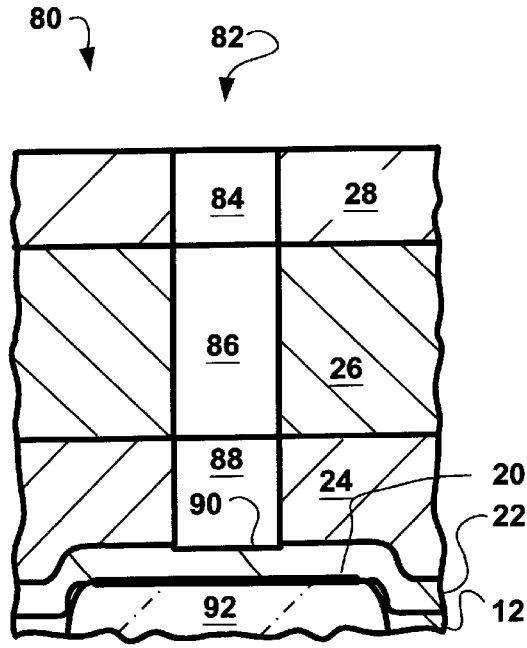
FIG. 12 is a partial close-up section of a semiconductor device diffusion contact with a contact hole subject to polymer buildup removal according to the present invention and elimination of fluorine where the device is near the edge of the semiconductor wafer.

Referring now to FIG. 12, therein is shown a partial close-up section of a portion of the semiconductor wafer with the semiconductor device 80 of FIG. 4 located at the edge of the wafer and processed in the same way as FIG. 4 through the $SiO_2$ plasma etch step. Then, the non-fluorine activating process is used to perform an in-situ removal of the polymer 30. The same numbers as used in FIG. 4 are used to designate the same elements.

With the non-fluorine activating removal of the polymer 30, the desired contact between the conductive metal in the hole and the silicide layer 20 over the diffusion contact 92 is achieved for reduced contact resistance with a long process time window.

In the semiconductor manufacturing process, the silicon substrate 12 of a wafer is processed using various photolithographic and deposition steps to produce the gates and diffusion contacts of the semiconductor transistor devices. Afterwards, various dielectric layers are deposited for the positioning of interconnects and vias, or holes, for the connection of the various semiconductor transistor devices.

Generally with reference to FIGS. 1 through 4 as being typical, the gate oxide 14 is deposited on the silicon substrate 12 followed by a polysilicon layer which is photolithographically patterned and etched to form the polysilicon gates 16 and 46 on the gate oxide 14. Afterwards, the spacer 18 is formed and etched along with the gate oxide 14 to form the structures shown in FIG. 1 and 2. Subsequently, the diffusion contacts 62 and 92 shown in FIG. 3 and 4 are implanted into the silicon substrate 12.

After implantation, the gates 16 and 46, and the diffusion contacts 62 and 92, are provided with the TiSi$_x$ silicide layer 20 which will improve the conductive bonding between the polysilicon/silicon and the conductive metal which will electrically interconnect the semiconductor transistor devices 10, 50, 70, and/or 80.

Next, the Si$_3$N$_4$ dielectric etch stop layer 22 is deposited over the silicided polysilicon gate 16 and 46, and the silicided diffusion contacts 62 and 92. The SiO$_2$ conformal dielectric layer 24 is then deposited over the Si$_3$N$_4$ dielectric etch stop layer 22. The SiO$_2$ leveling dielectric 26 is disposed over the SiO$_2$ conformal dielectric layer 24.

To form the hole or via, the photoresist 28 is deposited on the SiO$_2$ leveling dielectric 26 and then is photolithographically exposed and developed to form the holes 34 and 54 over the gates 16 and 46, respectively. The holes 74 and 84 are formed at the same time in the same process over the diffusion contacts 62 and 92.

High-density plasma etching employing fluorocarbon gases has been reported to have difficulty obtaining a high SiO$_2$-to-Si$_3$N$_4$ etching selectivity. This problem is considered to be caused mainly by the increase in fluorine atom density relative to fluorocarbon radical densities in the plasma. A fluorocarbon plasma containing high C/F ratio is usually employed to obtain good etch selectivity of SiO$_2$-to-Si$_3$N$_4$. Unfortunately, polymerization readily occurs in chemistries having high C/F ratios. Scanning electron microscope (SEM) analysis of semiconductor wafers revealed the formation of highly reactive, unsaturated polymers represented by the polymer layer 30 shown in FIGS. 1 through 4. This polymer layer 30 effects the selectivity of the SiO$_2$ such that the plasma etch to the diffusion contact 62 in FIG. 3 which is at the center of the wafer will stop exactly at the etch stop layer 22. However, the etch stop layer 22 will be progressively penetrated for etching of holes at the edge of the wafer, such as shown in FIGS. 4 and 1, and will be the worst for the etch to the gate 46 at the edge of the wafer. The process time window will be shortened because the following nitride etch would penetrate the thin nitride layer 22 of FIG. 2 and etch the silicide layer 20 over the gate 46 almost before the nitride etch would penetrate the fill nitride layer 22 of FIG. 3 over the diffusion contact 62. This would cause a high number of open or high contact resistance transistors.

A number of experiments were performed. Initially, 165 seconds of SiO$_2$ etch, including 50% over etch, and a selective Si$_3$N$_4$ etch of CHF$_3$/O$_2$ with different etch time splits were used. Process conditions of the Si$_3$N$_4$ etch were as follows: top power was 200 watts, bottom power was 100 watts, and chamber pressure was 60 mTorr. Chamber temperature was unchanged from the previous process step likewise clamping and backside helium cooling conditions were unchanged. Small amounts of oxygen are introduced in the fluorocarbon based plasmas during Si$_3$N$_4$ etch since oxygen deficiency causes a fluorocarbon layer (not shown) to form on the Si$_3$N$_4$ surface that inhibits the active species, fluorine atoms, from reaching this surface. This causes the etch rate to slow down, and sometimes an etch stop phenomenon to occur. Oxygen gas is used to suppress the formation of the fluorocarbon layer, resulting in a constant Si$_3$N$_4$ etch rate.

The results showed a rather limited process time window of Si$_3$N$_4$ etch where good, low contact resistances could be obtained for the polysilicon gates 16 and 46 and the diffusion contacts 62 and 92, simultaneously. Specifically, the process time window increased from 25 to 50 seconds. Thus, the process time window for plasma etching was 25 seconds. The viable process time window was also affected by SiO$_2$ etch time.

Tests run at 180 seconds showed zero process time window of Si$_3$N$_4$ etch in which the contact resistances were simultaneously low. There were some sites on the wafers that exhibited "conductive" resistances after 10 seconds of Si$_3$N$_4$ etch, although the resistances were high. Where 1200 kohm is defined as the contact "open", this phenomenon showed most of the polysilicon gate contacts had good resistances, 100–150 kohms, after 10 seconds of Si$_3$N$_4$ etch.

Efforts of understanding the differences between 165 and 180 second conditions and the extremely fast Si$_3$N$_4$ etch rates inside the contact holes were carried by comparing the SEM micrographs of two processed wafers. The Si$_3$N$_4$ layer lost around 300 Å over the polysilicon gate on both wafers, however, the process windows between these two wafers are unexpectedly different.

In trying to determine the reason for the differences between 165 seconds and 180 seconds of SiO$_2$ etch, it was theorized that the deposited polymer is thicker after 180 seconds SiO$_2$ etch and that the polymer 30 was a factor. It was speculated that, during the Si$_3$N$_4$ etch step, fluorine might be released from the thicker polymer and might act as an additional etchant for the Si$_3$N$_4$ layer 22. This additional fluorine source could enhance, significantly, the etch rate.

It was estimated that the Si$_3$N$_4$ etch rate is 2400 Å/min inside the contact hole. Nevertheless, the etch rate of Si$_3$N$_4$ by itself is only 1000 Å/min measured from the wafer (contact-mask-patterned single-Si$_3$N$_4$-film test wafer). A similar test was performed on other wafers to verify the polymerization effects. The test wafers were etched for 36 seconds of SiO$_2$ etch followed by 40 seconds of Si$_3$N$_4$ etch. The Si$_3$N$_4$ etch rate was, therefore, measured being 1350 Å/min, and which is larger than the 1000 Å/min obtained by using only Si$_3$N$_4$ etch step. Hence, the presence of fluorocarbon polymer could violate the designed etch formula, and be responsible for unexpected etch results.

The polymer 30, left by the SiO$_2$ etch, acting as an effective fluorine source was verified by testing an in-situ removal using the fluorine-less Ar/O$_2$ plasma with a limited lower electrode power as shown in FIGS. 5 through 8. Extra Si$_3$N$_4$ layer loss was evident over polysilicon gate and diffusion contact regions across the wafer, especially the Si$_3$N$_4$ layer 22 over the polysilicon gate 46 at the edge of the wafer tended to be punched through to the TiSi$_x$, as shown in FIG. 6. Since there was no fluorine source from the input gasses, this supported the theory of the polymer 30 as a detrimental fluorine source.

In order to test the process time window of the Si$_3$N$_4$ etch in the absence of the polymer it was necessary to remove the polymer, after SiO$_2$ etch, in an environment that would not etch the underlying Si$_3$N$_4$. A 30 seconds ash process in a microwave stripper using water vapor as the ashing agent accomplished this removal. Process conditions were as follows: power 1 KW, paddle temperature 250° C., and water vapor flow 300 sccm. As shown in FIGS. 9 through 12, the ashing process did not attack the Si$_3$N$_4$.

Further and most important, the contact resistance data indicates the process time window yielding good contact resistance in all contacts is increased from 70 to 110 seconds. This expands the usable process time from a window of 25 seconds to a window of 40 seconds increasing breadth of the window by 60%. The impact of this process as it interacts with the etch time is expected to be favorable as well.

For the present invention, a conventional dual-frequency plasma reactor is used, but with excitation frequencies of 27 and 2 MHz applied to the upper and lower powered electrodes, respectively. The 27 MHz is used to generate higher density plasmas than achieved with the conventional 13.56 MHz, and the 2 MHz is used to enhance the ion bombardment energy. The wafer backside helium pressure is 15 Torr, and the process chamber wall and electrostatic chuck temperatures are both 40° C.

The $SiO_2$ etch step was optimized to give a good selectivity of $SiO_2$-to-$Si_3N_4$. Generally, the ratio of C/F in the etch gas has always been taken as a measure for the etch selectivity. A gas mixture of $C_4F_8/CF_4/CO/Ar$ was used for the $SiO_2$ etch chemistry of the present invention. The selectivity dependence on the ratio of $C_4F_8/CF_4$ was studied for a 60 mTorr, top RF power was 800 watt, and Ar flow was 300 sccm process. A ratio of $C_4F_8CF_4=0.85$ provided sufficient $SiO_2$-to-$Si_3N_4$ selectivity to allow the $SiO_2$ to be etched while leaving a majority of the $Si_3N_4$ layer thickness behind even over the polysilicon gates at the edge of the wafer.

The main decomposition path of $C_4F_8$ is $C_4F_8$-$C_2F_4$-$CF_2$-CF+F, and CF is the polymer forming precursor. The increase of $C_4F_8$ gas flow effectively reduces the etch rate of the $Si_3N_4$ etch stop layer in the contact hole resulting an increased selective ratio. However, it may eventually cause etch-stop. Thus, the balance of deposition and etching must be controlled precisely. The addition of CO is also used to improve the etch selectivity of $SiO_2$-to-$Si_3N_4$; the free fluorine reacts with CO to form $COF_2$. The $SiO_2$ etch time was fixed to 165 seconds in order to minimize any deposition of polymer over the contact area, mainly the polysilicon gate contacts.

In an alternate mode, the polymer 30 can be removed by placing the wafer 100 on a hot plate and heating it to around 250° C. in an ozone ambient just before the nitride etch.

In a further alternate mode, the polymer 30 can be removed using a downstream oxygen plasma at a radio frequency operating range.

In a still further alternate mode, the polymer 30 can be removed using microwave energy in a downstream oxygen plasma.

In various modes, the oxygen for the plasma is obtained by the disassociation of water so that hydrogen will be available to react with the fluorine released during the removal of the polymer 30. The fluorine reacts to form hydrogen fluoride, which is a gas which can be easily removed from the contact hole and the downstream plasma chamber.

While the invention has been described in conjunction with a specific best mode, it is to be understood that many alternatives, modifications, and variations will be apparent to those skilled in the art in light of the aforegoing description. For example, high-density plasma sources operating at low-pressure regime, such as electron cyclotron resonance (ECR) and inductively coupled plasma (ICP) are alternative plasma sources because of their highly anisotropic etching with a high etching rate. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. A method for forming a contact hole to a silicided semiconductor contact in an interlayer oxide layer and a nitride etch stop layer on a semiconductor wafer during semiconductor manufacturing, comprising:

plasma etching a portion of the interlayer oxide layer in a predetermined configuration to form a first portion of the contact hole using a first high etch selective chemistry selective for the interlayer oxide layer relative to the nitride etch stop layer; said first high etch selective chemistry utilizing a fluorocarbon plasma having a high carbon to fluorine ratio whereby polymerization occurs forming a polymer over said first portion of the contact hole wherein said plasma etching said first portion uses a plasma with a gas mixture of $C_4F_8/CF_4/CO/Ar$ where the $C_4F_8/CF_4$ ratio is about 0.85;

removing said polymer from said first portion of the contact hole in the interlayer oxide layer; and plasma etching a portion of the nitride etch stop layer in said predetermined configuration to form a second portion of the contact hole open to said contact using a second high etch selective chemistry selective for the nitride etch stop layer relative to the silicided semiconductor contact.

2. The method as claimed in claim 1, including:

depositing a photoresist on the interlayer oxide layer;

photolithographically exposing and developing said photoresist to form a via therein;

plasma etching said first portion of the interlayer oxide layer through said via; and removing said polymer using a plasma containing hydrogen.

3. A method for forming a contact hole to a silicided semiconductor contact in an interlayer oxide layer and a nitride etch stop layer on a semiconductor wafer during semiconductor manufacturing, comprising:

plasma etching a portion of the interlayer oxide layer in a predetermined configuration to form a first portion of the contact hole using a first high etch selective chemistry selective for the interlayer oxide layer relative to the nitride etch stop layer; said first high etch selective chemistry utilizing a fluorocarbon plasma having a high carbon to fluorine ratio whereby polymerization occurs forming a polymer over said first portion of the contact hole;

removing said polymer from said first portion of the contact hole in the interlayer oxide layer wherein said removing said polymer is accomplished by a 30 second ash process in a microwave stripper using water vapor as the ashing agent with a water vapor flow 300 sccm; and plasma etching a portion of the nitride etch stop layer in said predetermined configuration to form a second portion of the contact hole open to said contact using a second high etch selective chemistry selective for the nitride etch stop layer relative to the silicided semiconductor contact.

4. The method as claimed in claim 3 wherein said removing said polymer includes heating the semiconductor wafer to around 250° C. in an ozone ambient.

5. The method as claimed in claim 3 wherein said removing said polymer using a downstream oxygen plasma operating at radio frequencies.

6. The method as claimed in claim 3 wherein said removing said polymer using a downstream oxygen plasma operating at microwave frequencies.

7. The method as claimed in claim 3 wherein said etching said interlayer oxide layer and removal of said polymer increases said nitride etching process time window from about 70 seconds to about 110 seconds.

8. A method for forming a contact hole to a silicided semiconductor contact in an interlayer oxide layer and a nitride etch stop layer on a semiconductor wafer during semiconductor manufacturing comprising:

plasma etching a portion of the interlayer oxide layer in a predetermined configuration to form a first portion of the contact hole using a first high etch selective chemistry selective for the interlayer oxide layer relative to the nitride etch stop layer; said first high etch selective chemistry utilizing a fluorocarbon plasma having a high carbon to fluorine ratio whereby polymerization occurs forming a polymer over said first portion of the contact hole wherein said plasma etching uses a dual-frequency plasma reactor with excitation frequencies of about 27 and 2 MHz applied to the upper and lower powered electrodes thereof, respectively, to generate higher density plasmas and to enhance ion bombardment energy, respectively;

removing said polymer from said first portion of the contact hole in the interlayer oxide layer; and plasma etching a portion of the nitride etch stop layer in said predetermined configuration to form a second portion of the contact hole open to said contact using a second high etch selective chemistry selective for the nitride etch stop layer relative to the silicided semiconductor contact.

9. A method for forming a contact hole to a silicided semiconductor contact in an interlayer oxide layer and a nitride etch stop layer on a semiconductor wafer during semiconductor manufacturing comprising:

plasma etching a portion of the interlayer oxide layer in a predetermined configuration to form a first portion of the contact hole using a first high etch selective chemistry selective for the interlayer oxide layer relative to the nitride etch stop layer; said first high etch selective chemistry utilizing a fluorocarbon plasma having a high carbon to fluorine ratio whereby polymerization occurs forming a polymer over said first portion of the contact hole wherein said plasma etching said interlayer oxide layer uses a plasma with gas mixture of $C_4F_8/CF_4/CO/Ar$ to etch $SiO_2$;

removing said polymer from said first portion of the contact hole in the interlayer oxide layer; and plasma etching a portion of the nitride etch stop layer in said predetermined configuration to form a second portion of the contact hole open to said contact using a second high etch selective chemistry selective for the nitride etch stop layer relative to the silicided semiconductor contact, wherein said plasma etching said nitride etch stop layer uses a plasma with a gas mixture of $CHF_3/O_2$ to etch $Si_3N_4$.

10. The method as claimed in claim 3, 8, or 9 including:

depositing a photoresist on the interlayer oxide layer;

photolithographically exposing and developing said photoresist to form a via therein;

plasma etching said first portion of the interlayer oxide layer through said via; and removing said polymer using a plasma containing hydrogen.

11. The method as claimed in claim 1, 8, or 9 wherein said removing said polymer includes heating the semiconductor wafer to around 250° C. in an ozone ambient.

12. The method as claimed in claim 1, 8, or 9 wherein said removing said polymer using a downstream oxygen plasma operating at radio frequencies.

13. The method as claimed in claim 1, 8, or 9 wherein said removing said polymer using a downstream oxygen plasma operating at microwave frequencies.

14. The method as claimed in claim 1, 8, or 9 wherein said etching said interlayer oxide layer and removal of said polymer increases said nitride etching process time window from about 70 seconds to about 110 seconds.

* * * * *

UNITED STATES PATENT AND TRADEMARK OFFICE
CERTIFICATE OF CORRECTION

PATENT NO. : 6,184,119 B1
DATED : February 6, 2001
INVENTOR(S) : Victor Ku and Delbert Parks It is certified that error appears in the above-identified patent and that said Letters Patent is hereby corrected as shown below:

Column 2,
Line 60, after "(PRIOR ART" insert -- ) is --

Column 3,
Line 27, delete "here" and insert -- where --

Column 7,
Line 48, delete "fill" and insert -- full --

Signed and Sealed this

Twenty-fifth Day of September, 2001

Attest:

*Nicholas P. Godici*

NICHOLAS P. GODICI
*Attesting Officer*  *Acting Director of the United States Patent and Trademark Office*